(12) United States Patent
Franklin et al.

(10) Patent No.: US 9,123,454 B2
(45) Date of Patent: Sep. 1, 2015

(54) DEVICE FOR ELECTRICAL CHARACTERIZATION OF MOLECULES USING CNT-NANOPARTICLE-MOLECULE-NANOPARTICLE-CNT STRUCTURE

(71) Applicant: International Business Machines Corporation, Armonk, NY (US)

(72) Inventors: Aaron D. Franklin, Croton on Hudson, NY (US); Joshua T. Smith, Croton on Hudson, NY (US); George S. Tulevski, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 13/686,964

(22) Filed: Nov. 28, 2012

(65) Prior Publication Data

US 2014/0131077 A1    May 15, 2014

Related U.S. Application Data

(63) Continuation of application No. 13/674,492, filed on Nov. 12, 2012.

(51) Int. Cl.
*B82Y 15/00* (2011.01)
*H01B 13/00* (2006.01)
*H05K 1/02* (2006.01)
*B82Y 30/00* (2011.01)
*B82Y 40/00* (2011.01)

(52) U.S. Cl.
CPC ............... *H01B 13/00* (2013.01); *B82Y 30/00* (2013.01); *H05K 1/0296* (2013.01); *B82Y 40/00* (2013.01); *Y10S 977/742* (2013.01)

(58) Field of Classification Search
CPC ........ H01B 13/00; B82Y 40/00; B82Y 30/00; Y10S 977/742; H05K 1/0296
USPC ......... 977/700, 742, 745, 748, 902, 953, 957, 977/958; 422/82.01, 82.02, 98
See application file for complete search history.

(56) References Cited

U.S. PATENT DOCUMENTS

| | | |
|---|---|---|
| 6,958,216 B2 | 10/2005 | Kelley et al. |
| 7,468,271 B2 | 12/2008 | Golovchenko et al. |
| 7,538,062 B1 | 5/2009 | Dai et al. |
| 2007/0200175 A1* | 8/2007 | Matsui et al. .................. 257/347 |
| 2010/0022083 A1 | 1/2010 | Gstrein et al. |
| 2011/0120868 A1 | 5/2011 | Lindsay et al. |
| 2011/0275062 A1 | 11/2011 | Guo et al. |
| 2011/0279125 A1 | 11/2011 | Bedell et al. |
| 2012/0073992 A1 | 3/2012 | Kim et al. |

OTHER PUBLICATIONS

H. Choi, et al., "Spontaneous Reduction of Metal Ion on the Sidewalls of Nanotubes," J. Am. Chem. Soc., vol. 124, No. 31, 2002, pp. 9058-9059.

(Continued)

*Primary Examiner* — Paul Hyun
*Assistant Examiner* — Robert Eom
(74) *Attorney, Agent, or Firm* — Cantor Colburn LLP; Vazken Alexanian

(57) ABSTRACT

A method of forming an electrode is disclosed. A carbon nanotube is deposited on a substrate. A section of the carbon nanotube is removed to form at least one exposed end defining a first gap. A metal is deposited at the at least one exposed end to form the electrode that defines a second gap.

6 Claims, 3 Drawing Sheets

(56) References Cited

OTHER PUBLICATIONS

A. Franklin, et al., "Controlled Decoration of Single-Walled Carbon Nanotubes with Pd Nanocubes," J. Phys. Chem C., vol. 111, No. 37, 2007, pp. 13756-13762.

X. Guo, et al., "Conductivity of a Single DNA Duplex Bridging a Carbon Nanotube Gap," Nature Nanotechnology, vol. 3, 2008, pp. 163-167.

S. Roy, et al., "Direct Electrical Measurements on Single-Molecule Genomic DNA Using Single-Walled Carbon Nanotubes," Nano Lett., vol. 8, No. 1, 2008, pp. 26-30.

PCT International Search Report and Written Opinion; International Application No. PCT/US13/54305; International Filing Date: Aug. 9, 2013; Date of Mailing: Aug. 25, 2014; pp. 1-15.

Wei, D. et al.; "Real Time and in Situ Control of the Gap Size of Nanoelectrodes for Molecular Devices", Nano Letters, vol. 8, No. 6, May 23, 2008, pp. 1625-1630.

X. Guo, et al., "Covalenty Bridging Gaps in Single-Walled Carbon Nanotubes with Conducting Molecules," Science vol. 311, No. 5759; Jan. 20, 2006; pp. 356-359.

* cited by examiner

DEVICE FOR ELECTRICAL CHARACTERIZATION OF MOLECULES USING CNT-NANOPARTICLE-MOLECULE-NANOPARTICLE-CNT STRUCTURE

CROSS REFERENCE TO RELATED APPLICATIONS

The present invention is a continuation of U.S. application Ser. No. 13/674,492, entitled "DEVICE FOR ELECTRICAL CHARACTERIZATION OF MOLECULES USING CNT-NANOPARTICLE-MOLECULE-NANOPARTICLE-CNT STRUCTURE," filed on Nov. 12, 2012, which is incorporated herein by reference in its entirety.

BACKGROUND

The present invention relates to electronic nanodevices, and more specifically, to a device for conducting electricity through a single molecule and methods of fabricating the device.

The current state of nanotechnology has allowed for the possibility of manufacturing electronic devices for applications on a molecular scale, including for example, devices for characterizing electrical properties of single molecules and devices that use single molecules in electronic applications. In exemplary molecular-scale devices, molecules may be inserted into a gap between ends of carbon nanotube (CNT) segments and coupled to the CNT ends to complete an electrical circuit. One of the primary difficulties in manufacturing these devices on the molecular scale is controlling the formation of the molecular-sized gaps between the ends of the CNT segments, often on the order of 1 to 10 nanometers (nm). One method uses lithography to pattern and etch a gap from a single carbon nanotube. However, lithographic methods are generally unstable at this length scale (less than 10 nm) and tend to produce gaps at random locations along the CNT and of varying gap sizes. As a result, lithography and etching on this length scale produces only a small yield of functioning devices.

SUMMARY

According to one embodiment of the present invention, a method of forming an electrode includes: depositing a carbon nanotube on a substrate; removing a section of the carbon nanotube to form at least one exposed end defining a first gap; and depositing a metal at the at least one exposed end to form the electrode that defines a second gap.

According to another embodiment of the present invention, a method forming a molecular dock includes: depositing a carbon nanotube on a substrate; removing a section of the carbon nanotube to form exposed ends of the carbon nanotube, wherein the exposed ends define a first gap; and depositing a metal at the exposed ends of the carbon nanotube to form the molecular dock having a second gap defined by the deposited metal.

According to another embodiment of the present invention, a method of controlling a separation between electrodes includes removing a section of a carbon nanotube to produce a first gap having a first gap length; and depositing a metal of a selected length in the first gap to control formation of the electrodes separated by a second gap having a selected length.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Disclosed herein is a method of producing a device that includes a carbon nanotube (CNT) having a gap formed therein. In various embodiments, the length or size of the gap is a consistently reproducibly in a sub-10 nm length scale. The present invention embodiments produce the sub-10 nm gap in several stages. First, a first gap is formed in the CNT channel using lithographic and etching processes. The length or size of the first gap is greater than a lower limit of lithography and etching processes. Lithography and etching generally produces gaps with highly-controlled lengths or sizes and locations when the gap size is above this lower limit, but produces gaps of inconsistent lengths/sizes and location when the gap size is less than this lower limit. Once the first gap is formed, a metal may be deposited in the first gap to create a second gap defined by a separation between the metals deposited in the first gap. The length of the metals is generally a known value and as a result the length of the metals in the first gap is controllable. Thus, the length of the second gap, which is a composite of the length or size of the first gap and the length or size of the metal, may be controlled. The metal deposited in the first gap form electrodes, which may be used in molecular-sized devices. In various embodiments, the size of the first gap may be selected or adjusted to produce a desired length of the second gap.

Figure 1:
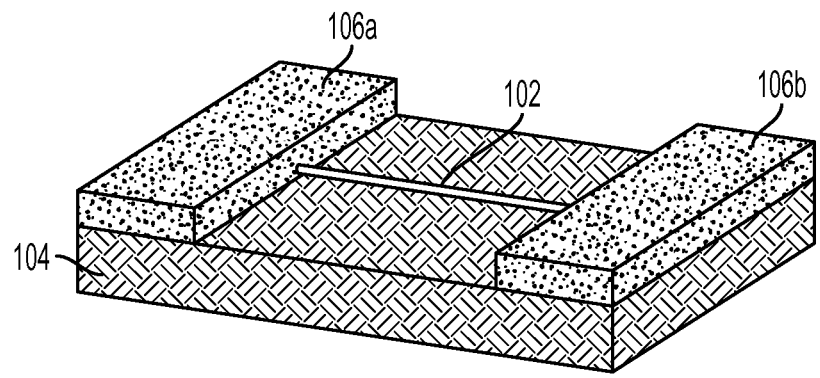
FIG. 1 shows a carbon nanotube disposed on a substrate and extending between two contacts.

FIGS. 1-4 show a manufacturing process for creating CNT electrodes according to an exemplary embodiment of the present invention. FIG. 1 shows a carbon nanotube 102 disposed on a substrate 104 and extending between two contacts 106a and 106b. One end of the carbon nanotube 104 is electrically coupled to the first contact 106a and an opposing end of the carbon nanotube is electrically coupled to the second contact 106b. Then carbon nanotube 102 may therefore be used to conduct electricity between the contacts 106a and 106b. In an exemplary embodiment, the carbon nanotube 102 forms a substantially straight line between the first contact 106a and the second contact 106b. A distance between first contact 106a and second contact 106b may be on the order of hundreds of nanometers in an exemplary embodiment.

Figure 2:
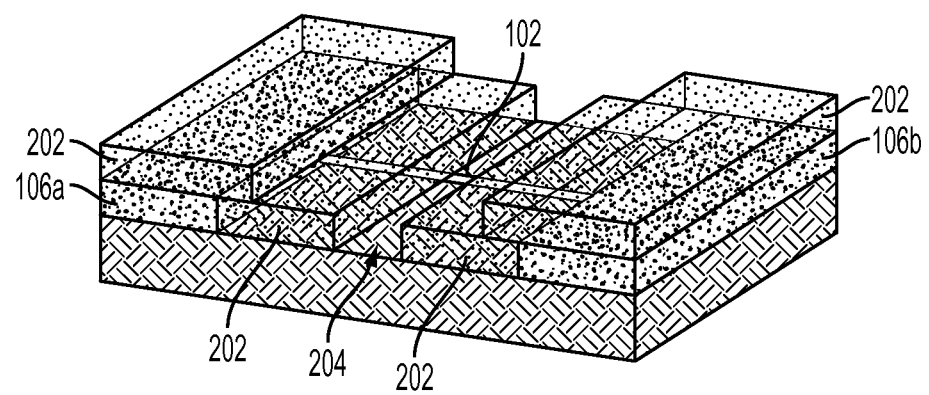
FIG. 2 shows a patterned resist disposed on the substrate and carbon nanotube of FIG. 1.

FIG. 2 shows a patterned resist 202 disposed on the substrate and CNT of FIG. 1. The resist 202 may be any type of resist used in lithography and etching. The resist 202 is deposited on the carbon nanotube 102, substrate 104 and contacts 106a and 106b to a selected depth. A window 204 may then be formed in the resist 202 to expose a section of the CNT 102. The window 202 may be formed by lithographically transferring a window pattern to the resist and removing the resist that receives the window pattern. The length or size of the window 202 is selected to be large enough that the lithographic process is able to produce the window with an acceptable control over the length or size of the window. In various embodiments, the length or size of the window is greater than about 10 nanometers (nm).

Figure 3:
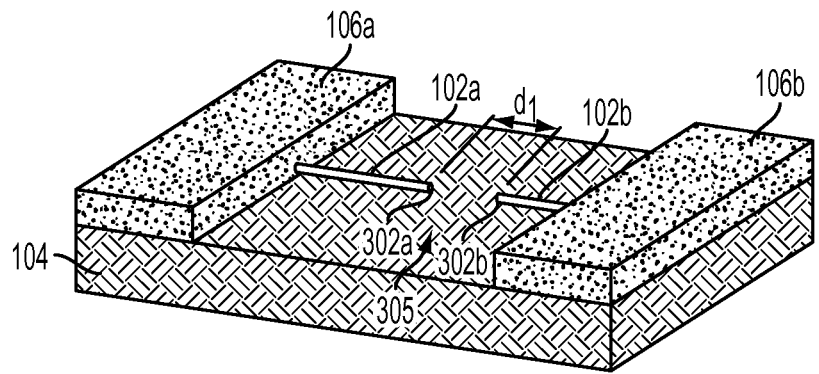
FIG. 3 shows carbon nanotube segments resulting from etching the carbon nanotube.

FIG. 3 shows carbon nanotube segments 102a and 102b resulting from etching the carbon nanotube 102. Etchant is introduced into the window 202 formed in FIG. 2 in order to etch away the exposed section of the CNT 102 exposed by the window 202. In an exemplary embodiment, the etchant may be oxygen plasma. Once the exposed section is etched away and the resist is removed, the two carbon nanotube segments 102a and 102b remain. The carbon nanotube segments 102a and 102b are substantially collinear and have exposed ends 302a and 302b respectively that are formed by the etching process. The exposed ends 302a and 302b are opposed to each other across formed gap 305, referred to herein as the first gap. The first gap 305 has a length $d_1$ and is a defined by the distance between the exposed ends 302a and 302b. In various embodiments, the length $d_1$ of the first gap 305 is greater than about 10 nm.

Figure 4:
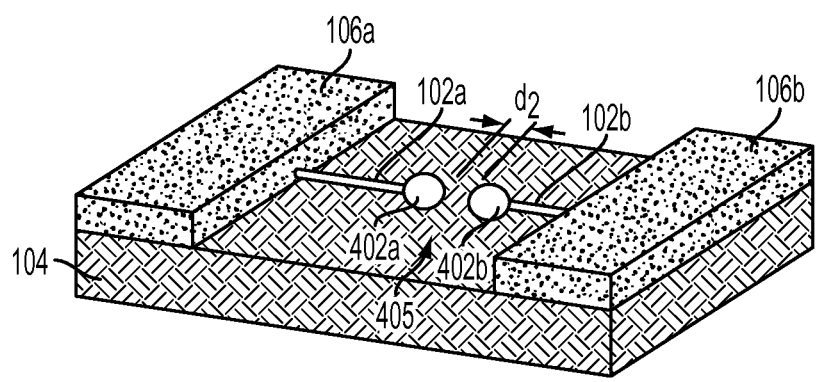
FIG. 4 shows a device that includes metal deposited on the formed ends of respective carbon nanotube segments to create electrodes.

FIG. 4 shows a device 400 that includes metal deposited on the formed ends 302a and 302b of respective carbon nanotube segments 102a and 102b to create electrodes 402a and 402b. In an exemplary embodiment, the metal may be deposited using electroless deposition process. The substrate of FIG. 3 may be immersed in a solution containing selected metal ions that have a redox potential higher than the redox potential of the CNT segments 102a and 102b. In an exemplary embodiment, the solution may include $PdCl_2$ in HCl acid solution which contains $Pd^{2+}$ ions. In alternate embodiments, the solution may include Pd, Pt and Au as well as other metal that may be suitable for deposition. Since the metal ions have a redox potential higher than the redox potential of the CNT segments 102a and 102b, the metal ions reduce at the opened ends 302a and 302b of the CNT segments 102a and 102b to form electrodes 402a and 402b at the formed ends 302a and 302b. The metal ions may grow at the opened ends 302a and 302b up until a saturation point or until an electrochemical equilibrium is reached. The length of the metals deposited is known. Therefore, the length of the electrodes 402a and 402b may be controlled. The electrodes 402a and 402b form a second gap 405 having a length or size $d_2$. The length or size of the second gap 405 depends of the length or size of the first gap 305 and the length of the electrodes 402a and 402b. In an exemplary embodiment, the length of at least one of the electrodes 402a and 402b is a diameter of a single metal ion. In an alternate embodiment, the length of the electrodes 402a and 402b may be controlled by controlling the rate of ion growth at the ends 302a and 302b. Knowing a rate of ion growth and/or a concentration of the solution, the deposition may be stopped at a selected time to form electrodes 402a and 402b of a selected length. In various embodiments, the electrodes 402a and 402b may be used to provide a molecular dock for reception of a single molecule. The molecule may then complete an electrical connection between the contacts 106a and 106b. Electrical properties of the molecule may then be tested. Alternatively, the electrical properties of the molecule may be used to perform a function. Additional functions of the electrodes 402a and 402b besides those specifically disclosed herein are within the scope of the invention.

Figure 5:
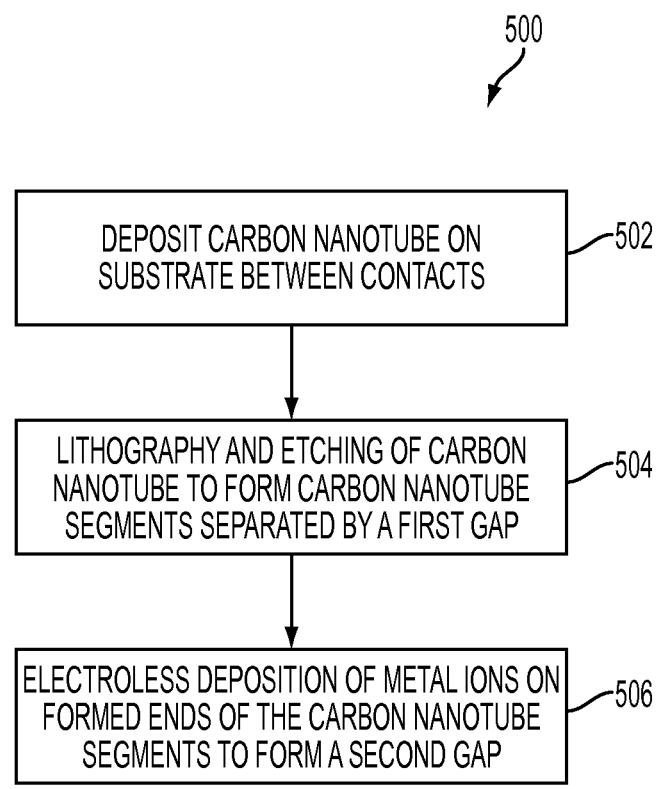
FIG. 5 shows a flowchart illustrating an exemplary method of manufacturing the exemplary molecular electronic device of the present invention.

FIG. 5 shows a flowchart illustrating an exemplary method of manufacturing the exemplary molecular electronic device of the present invention. In block 502, a carbon nanotube 102 is deposited in a substrate 104 between two contacts 106a and 106b to form a substantially linear carbon nanotube channel. In block 504, a first gap is formed in the carbon nanotube channel using lithography and etching methods. The carbon nanotube channel is thus segmented into a first carbon nanotube segment 102a and a second carbon nanotube segment 102b separated by the first gap 305. The first gap is large enough where lithography and etching can produce a gap of suitably controllable size and location. In block 506, a second gap is formed in the first gap by electroless deposition of metal in the first gap. The length of the metal that is deposited in the first gap is a known value. In various embodiments, the length of the metal is a length of a single metal ion. Since the second gap is formed by two processes that are operated over length scales over which length or size may be substantially controlled, (i.e., greater than about 10 nm for lithography and etching of the first gap and less than about 10 nm for electroless deposition to form the second gap) the length of the second gap is controlled to a selected precision. As an illustrative example, the first gap may be etched in the nanotube to 20 nm (+/−2 nm). Nanoparticles that are 7 nm in diameters may be deposited in the first gap using electroless deposition. The resulting second gap is therefore about 6 nm (+/−2 nm). The length or size of the second gap is below the lower length or size limit for which lithography and etching may control the length/size and location of the gap.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A device, comprising:
a first carbon nanotube segment of a carbon nanotube disposed on a substrate, the first carbon nanotube segment having a first end;
a second carbon nanotube segment of the carbon nanotube having a second end, wherein the first end and the second end define a distance having a first length;
a first metal electrode deposited on the first end; and
a second metal electrode deposited on the second end, wherein the first metal electrode and the metal second electrode define a gap having a second length.

2. The device of claim 1, wherein the first length is equal to a sum of the second length, a length of the first metal electrode, and a length of the second metal electrode.

3. The device of claim 1, wherein the first length is greater than about 10 nanometers.

4. The device of claim 1, wherein the second length is less than about 10 nanometers.

5. The device of claim 1, wherein the first metal electrode and the second metal electrode define a molecular dock.

6. The device of claim 1, wherein the first length is greater than about 10 nanometers and the second length is less than about 10 nanometers.

* * * * *